US012813167B2

(12) United States Patent
Dong et al.

(10) Patent No.: US 12,813,167 B2
(45) Date of Patent: Nov. 24, 2026

(54) SEMICONDUCTOR DEVICE AND METHOD FOR FABRICATING THE SAME

(71) Applicant: SK hynix Inc., Icheon-si (KR)

(72) Inventors: Cha Deok Dong, Icheon-si (KR); Jeong Myeong Kim, Icheon-si (KR); Keo Rock Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 351 days.

(21) Appl. No.: 18/584,931

(22) Filed: Feb. 22, 2024

(65) Prior Publication Data

US 2025/0089582 A1 Mar. 13, 2025

(30) Foreign Application Priority Data

Sep. 7, 2023 (KR) ........................ 10-2023-0119007

(51) Int. Cl.
*H10N 70/00* (2023.01)
*H10B 63/00* (2023.01)

(52) U.S. Cl.
CPC ........... *H10N 70/841* (2023.02); *H10B 63/84* (2023.02); *H10N 70/021* (2023.02)

(58) Field of Classification Search
CPC .. H10N 70/021; H10N 70/041; H10N 70/043; H10N 70/826; H10N 70/841; H10B 61/10; H10B 63/20; H10B 63/80; H10B 63/84
See application file for complete search history.

(56) References Cited

U.S. PATENT DOCUMENTS

2006/0019441 A1 1/2006 Jeng et al.
2015/0041750 A1* 2/2015 Cai ........................ H10B 63/80 257/4
2021/0074917 A1* 3/2021 Su ........................ H10N 70/826
2022/0140239 A1* 5/2022 Su ........................ H10N 70/826 257/4
2023/0131200 A1* 4/2023 Ha ........................ H10B 61/10 257/4

FOREIGN PATENT DOCUMENTS

KR 20040100015 A 12/2004

* cited by examiner

*Primary Examiner* — David C Spalla
(74) *Attorney, Agent, or Firm* — Ashurst Perkins Coie US LLP

(57) ABSTRACT

A semiconductor device and a method for fabricating the same are provided. The semiconductor device includes a selector pattern including an insulating material doped with a dopant to exhibit different electrical conducting characteristics in response to an applied voltage with respect to a threshold voltage, wherein the selector pattern includes a first region that is formed in an edge extending from a sidewall of the selector pattern and a second region that has a sidewall in contact with the first region, and a concentration of the dopant in the first region is different from a concentration of the dopant in the second region.

11 Claims, 9 Drawing Sheets

SEMICONDUCTOR DEVICE AND METHOD FOR FABRICATING THE SAME

This patent document claims priority under 35 U.S.C. § 119 to Korean Patent Application No. 10-2023-0119007 filed on Sep. 7, 2023, which is incorporated herein by reference in its entirety.

TECHNICAL FIELD

This patent document relates to a semiconductor technology, and more particularly, to a semiconductor device including a selector, and a method for fabricating the same.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

In an embodiment, a semiconductor device may include: a selector pattern including an insulating material doped with a dopant to exhibit different electrical conducting characteristics in response to an applied voltage with respect to a threshold voltage, wherein the selector pattern includes a first region that is formed in an edge extending from a sidewall of the selector pattern and a second region that has a sidewall in contact with the first region, and a concentration of the dopant in the first region is different from a concentration of the dopant in the second region.

In an embodiment, a method for fabricating a semiconductor device, may include: forming a selector layer by performing a first dopant implantation process to an insulating material layer so that the dopped insulating material layer of the selector layer exhibits different electrical conducting characteristics in response to an applied voltage with respect to a threshold voltage; forming an electrode layer over the selector layer; forming a hard mask pattern over the electrode layer; forming an electrode pattern by etching the electrode layer using the hard mask pattern as an etch barrier in order to expose the selector layer; performing a second dopant implantation process to the selector layer in a direction at an acute angle with respect to an upper surface of the selector layer; and forming a selector pattern by etching the selector layer exposed by the electrode pattern.

DETAILED DESCRIPTION

Figure 1:
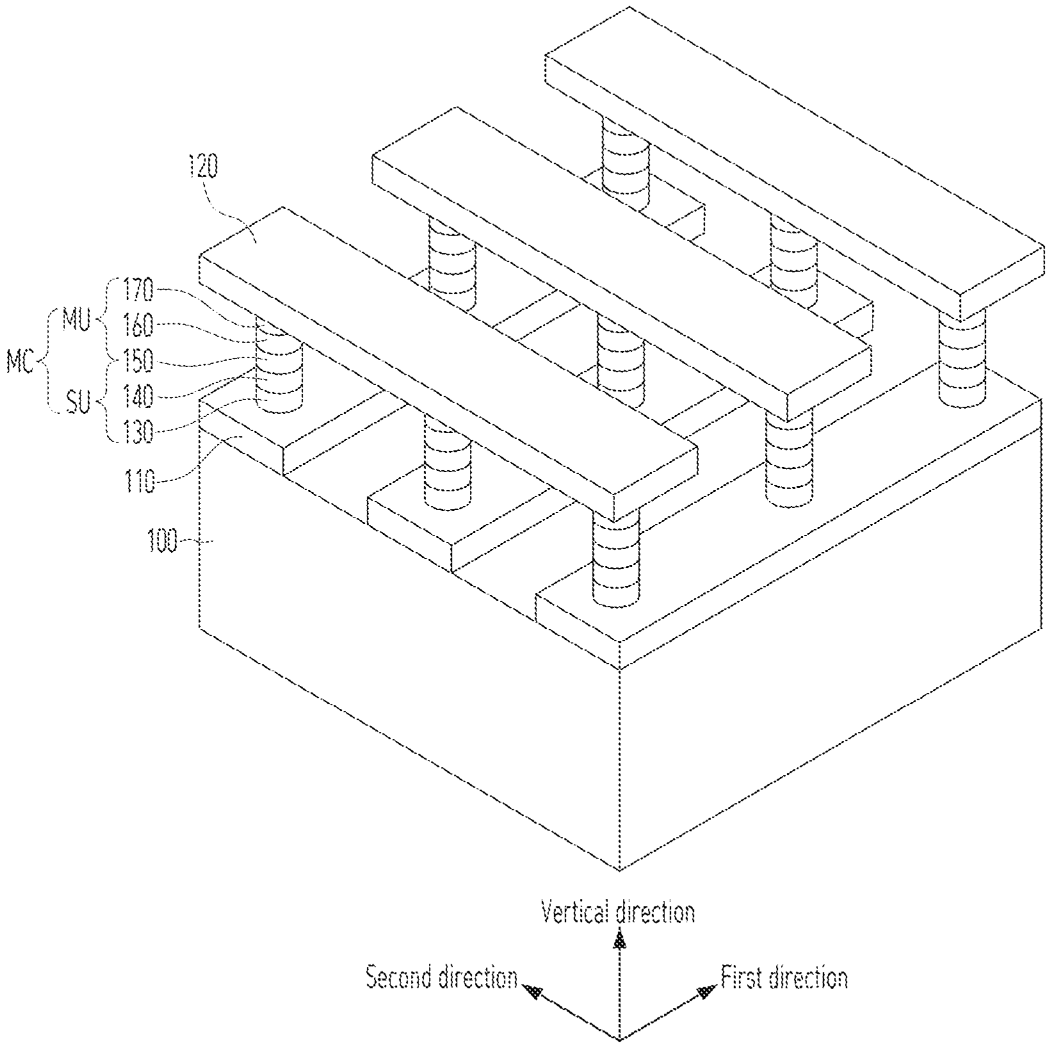
FIG. 1 is a perspective view illustrating an example of a semiconductor device based on some implementations of the disclosed technology.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a perspective view illustrating a semiconductor device according to an embodiment of the present disclosure.

Referring to FIG. 1, a semiconductor device according to the present embodiment may include a substrate 100, a plurality of first conductive lines 110 disposed over the substrate 100 and extending in a first direction, a plurality of second conductive lines 120 disposed over the first conductive lines 110 and extending in a second direction intersecting the first direction, and a plurality of memory cells MC interposed between the first conductive lines 110 and the second conductive lines 120 and respectively overlapping intersection regions of the first conductive lines 110 and the second conductive lines 120.

The substrate 100 may include a semiconductor material such as silicon. In addition, the substrate 100 may include a desired lower structure (not shown). For example, the substrate 100 may include an integrated circuit for driving the first conductive lines 110 and/or the second conductive lines 120.

The plurality of first conductive lines 110 may be arranged to be spaced apart from each other in the second direction. The first conductive line 110 may include at least one of various conductive materials, for example, a metal such as platinum (Pt), tungsten (W), aluminum (Al), copper (Cu), tantalum (Ta), or titanium (Ti), a metal nitride such as titanium nitride (TIN), tantalum nitride (TaN), or tungsten nitride (WN), or a combination thereof, and may have a single-layer structure or a multi-layer structure.

The plurality of second conductive lines 120 may be arranged to be spaced apart from each other in the first direction. The second conductive line 120 may include at least one of various conductive materials, for example, a metal such as platinum (Pt), tungsten (W), aluminum (Al), copper (Cu), tantalum (Ta), or titanium (Ti), a metal nitride such as titanium nitride (TIN), tantalum nitride (TaN), or tungsten nitride (WN), or a combination thereof, and may have a single-layer structure or a multi-layer structure.

Each of the plurality of memory cells MC may include a memory unit MU that is a part where data is actually stored, and a selector unit SU that controls access to the memory unit MU by controlling the current flow through selector unit SU to reach the corresponding memory cell MC. For example, the memory cell MC may be a patterned stack of different layers and may include a stacked structure of a lower electrode layer 130 (or a lower electrode pattern or electrode layer pattern), a selector layer 140 (or a selector pattern or selector layer pattern), a middle electrode layer 150, a variable resistance layer 160 (or a middle electrode pattern or electrode layer pattern), and an upper electrode layer 170 (or an upper electrode pattern or electrode layer pattern). In some implementations, the selector unit SU may include the lower electrode layer 130, the selector layer 140, and the middle electrode layer 150, and the memory unit MU may include the middle electrode layer 150, the variable resistance layer 160, and the upper electrode layer 170. The middle electrode layer 150 may be shared by the selector unit SU and the memory unit MU.

The lower electrode layer 130 and the upper electrode layer 170 may be located at both ends of the memory cell MC, for example, at the bottom and top, respectively, and may function to transmit a voltage or current that is necessary for operating the memory cell MC.

The middle electrode layer 150 may function to physically separate and electrically connect the selector layer 140 and the variable resistance layer 160. The lower electrode layer 130, the middle electrode layer 150, or the upper electrode layer 170 may include at least one of various conductive materials, for example, a metal such as platinum (Pt), tungsten (W), aluminum (Al), copper (Cu), tantalum (Ta), or titanium (Ti), a metal nitride such as titanium nitride (TiN), tantalum nitride (TaN), or tungsten nitride (WN), or a combination thereof. In some implementations, the lower electrode layer 130, the middle electrode layer 150, or the upper electrode layer 170 may include a carbon electrode.

The selector layer 140 may control access to the variable resistance layer 160, and may prevent or reduce current leakage that occurs between the memory cells 120 sharing the first conductive line 110 or the second conductive line 120. For example, the selector layer 140 may have a threshold switching characteristic by exhibiting two different electrical conducting states: a first electrical conducting state in which a current is blocked or hardly flows in the selector layer 140 when the magnitude of the voltage supplied to the selector layer 140 is less than a predetermined threshold voltage, and a second electrical conducting state in which the current rapidly flows through the selector layer 140 at a voltage equal to or higher than the threshold voltage. Thus, the selector layer 140 may be turned on to be in the second electrical conducting state and thus electrically conducting when the applied voltage is above the threshold voltage and to be in the first electrical conducting state for being turned off when the applied voltage is below the threshold voltage. In an example, the selector layer 140 may include an insulating material implanted with a dopant to achieve the above threshold switching characteristic with the two different electrical conducting states. The selector unit SU including the selector layer 140 and its operation will be described in more detail with reference to FIGS. 2 and 3 below. Because the selector layer 140 exhibits different electrical conducting characteristics in response to an applied voltage with respect to a threshold voltage and thus can be controlled via the applied voltage to be selected in one of the two different electrical conducting states, the selector layer 140 functions as a selector for selecting whether the memory cell MC embodying the selector layer 140 is selected or not.

Figure 2:
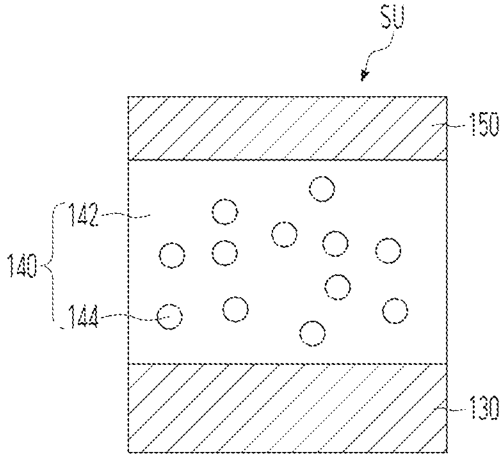
FIG. 2 is a cross-sectional view showing an example of a selector unit based on some implementations of the disclosed technology.

FIG. 2 is a cross-sectional view showing the selector unit in more detail.

Referring to FIG. 2, the selector unit SU may include the lower electrode layer 130, the selector layer 140, and the middle electrode layer 150.

As described above, the lower electrode layer 130 and the middle electrode layer 150 may include at least one of various conductive materials such as a metal or a metal nitride. The lower electrode layer 130 and the middle electrode layer 150 may be made of or include the same material, and accordingly, may have the same work function. For example, the lower electrode layer 130 and the middle electrode layer 150 may include titanium nitride (TiN) having a work function of 4.4 to 4.6 eV. However, the present disclosure is not limited thereto, and the lower electrode layer 130 and the middle electrode layer 150 may be formed of or include different materials, and thus, may have different work functions.

The selector layer 140 may include an insulating material layer 142 and a dopant 144 implanted into the insulating material layer 142.

The insulating material layer 142 may include an insulating material with a relatively wide band gap, for example, an insulating material with a band gap of 5.0 eV or more. For example, the insulating material layer 142 may include a silicon-containing insulating material such as silicon oxide, silicon nitride, or silicon oxynitride, an insulating metal oxide, or an insulating metal nitride, or a combination thereof. There may be a deep trap within the insulating material layer 142 having an energy level closer to the energy level of the valence band of the insulating material layer 142 than the energy level of the conduction band of the insulating material layer 142. The dopant 144 may serve to create a shallow trap that provides a passage for conductive carriers, such as electrons or holes, to move within the insulating material layer 142. The shallow trap may have an energy level that is closer to the energy level of the conduction band of the insulating material layer 142 than the energy level of the valence band of the insulating material layer 142. For example, when the insulating material layer 142 contains silicon, the dopant 144 may include a metal having a valence different from that of silicon, such as gallium (Ga), boron (B), indium (In), phosphorus (P), arsenic (As), antimony (Sb), germanium (Ge), carbon (C), or tungsten (W), or a combination thereof. In some implementations, when the insulating material layer 142 contains a metal, the dopant 144 may include a metal having a valence different from that of the metal, silicon, or others. For example, the insulating material layer 142 may include silicon oxide, such as silicon dioxide ($SiO_2$), and the dopant 144 may include arsenic (As). In some implementations, the selector layer 140 may include silicon dioxide ($SiO_2$) doped with arsenic (As).

The operation of the selector unit SU will be described with reference to FIGS. 3A and 3B as follows.

Figure 3A:
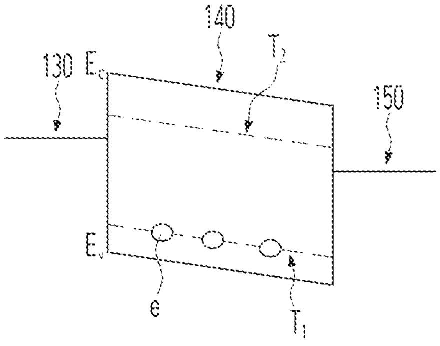
FIGS. 3A and 3B are views illustrating examples of an operation of a selector unit of FIG. 2 based on some implementations of the disclosed technology.
Figure 3B:
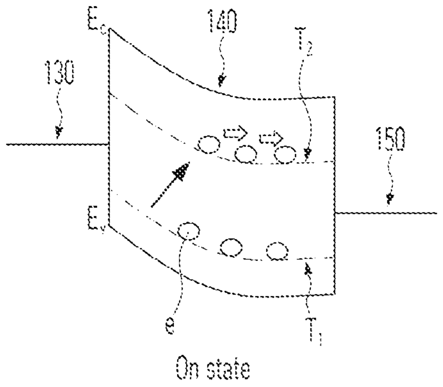

FIGS. 3A and 3B are views illustrating the operations of the selector unit of FIG. 2.

Referring to FIG. 3A, in an off state in which no current flows through the selector unit SU and no voltage is applied to the selector unit SU, conductive carriers, for example, electrons (e), may be trapped in the deep trap T1 of the selector layer 140.

When a voltage equal to or higher than the threshold voltage is applied to the selector unit SU in the off state through the lower electrode layer 130 and the upper electrode layer 150, an on state in which current flows through the selector unit SU may be implemented as shown in FIG. 3B. When a voltage equal to or higher than the threshold voltage is applied to the selector unit SU, the conductive carriers trapped in the deep trap T1 may jump to the shallow trap T2 by thermal emission or tunneling, and the conductive carriers may move through the shallow trap T2. Therefore, a conductive path connecting the lower electrode layer 130 and the upper electrode layer 150 may be created.

When a voltage applied to the selector unit SU in the on state decreases, the number of the conductive carriers moving from the deep trap T1 to the shallow trap T2 may decrease, and the selector unit SU may be turned off again.

In this way, turn-on and turn-off of the selector unit SU may be performed.

Referring again to FIG. 1, the variable resistance layer 160 may be a part that functions to store data in the memory cell MC. In the example, the variable resistance layer 160 may have a variable resistance characteristic that switches between different resistance states depending on a voltage applied thereto and the different resistance states are used for storing data. The variable resistance layer 160 may have a single-layer structure or a multi-layer structure including at least one of various materials used in RRAM, PRAM, FRAM, MRAM, etc., for example, a metal oxide such as a transition metal oxide or a perovskite-based material, a phase change material such as a chalcogenide-based material, a ferroelectric material, a ferromagnetic material, or the like. For example, the variable resistance layer 160 may include a magnetic tunnel junction structure that can store data by switching between different resistance states by changing a magnetization direction. This will be described in more detail with reference to FIG. 4 below.

Figure 4:
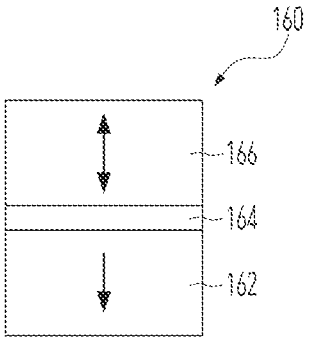
FIG. 4 is a cross-sectional view illustrating an example of a variable resistance layer based on some implementations of the disclosed technology.

FIG. 4 is a cross-sectional view illustrating an example of a variable resistance layer.

Referring to FIG. 4, the variable resistance layer 160 may be or include a magnetic tunnel junction structure, and may include a pinned layer 162, a tunnel barrier layer 164, and a free layer 166.

The pinned layer 162 may be a layer that has a fixed magnetization direction that can be compared to the magnetization direction of the free layer 166, and may also be called a reference layer. The free layer 166 may be a layer that has a changeable magnetization direction to store data, and may also be called a storage layer. The tunnel barrier layer 164 may physically separate the pinned layer 162 and the free layer 166, and may enable tunneling of electrons between the pinned layer 162 and the free layer 166 as needed. Each of the pinned layer 162 and the free layer 166 may have a single-layer structure or a multi-layer structure including a ferromagnetic material, for example, an alloy containing Fe, Ni, or Co as a main component. For example, each of the pinned layer 162 and the free layer 166 may include at least one of Fe—Pt alloy, Fe—Pd alloy, Co—Pd alloy, Co—Pt alloy, Fe—Ni—Pt alloy, Co—Fe—Pt alloy, Co—Ni—Pt alloy, or Co—Fe—B alloy, or at least one of a stacked structure of Co/Pt or a stacked structure of Co/Pd. The tunnel barrier layer 164 may have a single-layer structure or a multi-layer structure including an insulating material. In an example, the tunnel barrier layer 164 may include an insulating oxide such as MgO, CaO, SrO, TiO, VO, or NbO.

In this magnetic tunnel junction structure, the magnetization direction of the free layer 166 may vary depending on the applied voltage or current. When the magnetization direction of the free layer 166 is parallel to the magnetization direction of the pinned layer 162, the magnetic tunnel junction structure may have a low resistance state, and, for example, may store data '1'. On the other hand, when the magnetization direction of the free layer 166 is anti-parallel to the magnetization direction of the pinned layer 162, the magnetic tunnel junction structure may have a high resistance state, and, for example, may store data '0'.

As long as the magnetic tunnel junction structure includes the pinned layer 162, the free layer 166, and the tunnel barrier layer 164 therebetween, the layer structure of the magnetic tunnel junction structure may be modified in various ways. In an example, the positions of the pinned layer 162 and the free layer 166 may be reversed with each other. In another example, although not shown, one or more layers to improve the characteristics of the magnetic tunnel junction structure may be further included to the magnetic tunnel junction structure.

Referring again to FIG. 1, the memory cell MC may have a pillar shape that respectively overlaps the intersection regions of the first conductive lines 110 and the second conductive lines 120. In FIG. 1, the memory cell MC is shown as having a cylindrical shape, but the present disclosure is not limited thereto, and the memory cell MC may have at least one of various shapes such as a square pillar, a rectangular pillar, or an elliptical pillar. In addition, in FIG. 1, the layers 130 to 170 forming the memory cell MC are shown as having sidewalls aligned with each other by being patterned using a single mask, but the present disclosure is not limited thereto. For example, when the variable resistance layer 160 has a multi-layer structure such as a magnetic tunnel junction structure, it may be difficult to collectively etch the layers 130 to 170. In this case, the selector layer 140 and the variable resistance layer 160 may be patterned separately using different masks, and thus, the selector layer 140 and the variable resistance layer 160 may have sidewalls that are not aligned with each other. The lower electrode layer 130 may be patterned together with the selector layer 140, the upper electrode layer 170 may be patterned together with the variable resistance layer 160, and the middle electrode layer 150 may be patterned together with one of the selector layer 140 and the variable resistance layer 160.

There can be many modifications made to the layer structure of the memory cell MC without being limited to what is shown and described above. For example, the stacking order of the layers forming the memory cell MC may be changed, one or more of the layers forming the memory cell MC may be omitted, and/or one or more layers (not shown) may be added to the memory cell MC. In an example, one or more of the lower electrode layer 130, middle electrode layer 150, and upper electrode layer 170 may be omitted. In some examples, the positions of the selector layer 140 and the variable resistance layer 160 may be reversed with each other. In some examples, one or more layers (not shown) may be added to the memory cell MC to improve the process or the characteristics of the memory cell MC.

When a selector layer is formed of or includes an insulating material that is implanted with a dopant, a problem may occur in which the dopant is lost from the sidewall edge of the selector layer during the process of patterning the selector layer into a pillar shape. In this case, the sidewall edge of the selector layer may become a dead layer, making the switching operation difficult. Hereinafter, a method of forming a selector layer to solve this problem and a selector pattern formed accordingly will be described. In the description below, the selector pattern and/or the selector may refer to a structure of the selector.

FIGS. 5A to 5E are cross-sectional views illustrating a semiconductor device and a method for fabricating the same according to an embodiment of the present disclosure.

First, the fabricating method will be described.

Figure 5A:
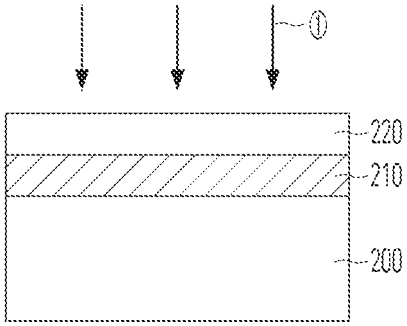
FIGS. 5A to 5E are cross-sectional views illustrating an example of a semiconductor device and a method of fabricating the semiconductor device based on some implementations of the disclosed technology.

Referring to FIG. 5A, a substrate 200 in which a predetermined lower structure is formed may be provided. The substrate 200 may include various circuits. For example, the substrate 200 may include a conductive line similar to the first conductive line 110 of FIG. 1 described above.

Subsequently, a lower electrode layer 210 and an initial selector layer 220 may be formed over the substrate 200. The lower electrode layer 210 may be formed by depositing a conductive material. The initial selector layer 220 may be formed by depositing an insulating material layer over the lower electrode layer 210 and implanting a dopant into the insulating material layer. The implantation of the dopant may be performed, for example, by an ion implantation method, and may be performed toward the insulating material layer in a direction substantially perpendicular to the upper surface of the substrate 200 (see arrow ①). The implantation of the dopant will be referred to as a first dopant implantation process.

Figure 5B:
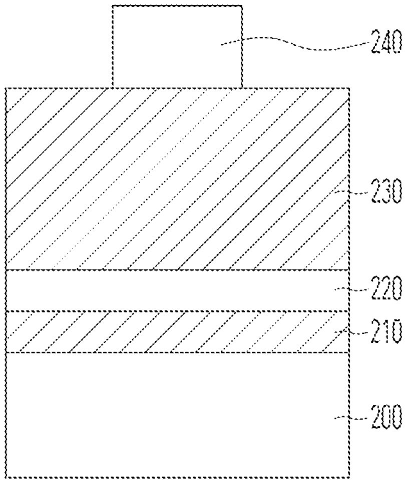

Referring to FIG. 5B, a middle electrode layer 230 may be formed over the initial selector layer 220. The middle electrode layer 230 may be formed by depositing a conductive material. The middle electrode layer 230 may function as an etch barrier when etching the initial selector layer 220 and the lower electrode layer 210, together with a hard mask pattern 240 to be described later. Therefore, the middle electrode layer 230 may be formed to have a thickness greater than a thickness of the lower electrode layer 210.

Subsequently, the hard mask pattern 240 may be formed over the middle electrode layer 230. The hard mask pattern 240 may be used to pattern the lower electrode layer 210, the initial selector layer 220, and the middle electrode layer 230 into a pillar shape, and may have an island shape. The hard mask pattern 240 may include at least one of various materials having different etch rates from the lower electrode layer 210, the initial selector layer 220, and the middle electrode layer 230, and may have a single-layer structure or a multi-layer structure.

Figure 5C:
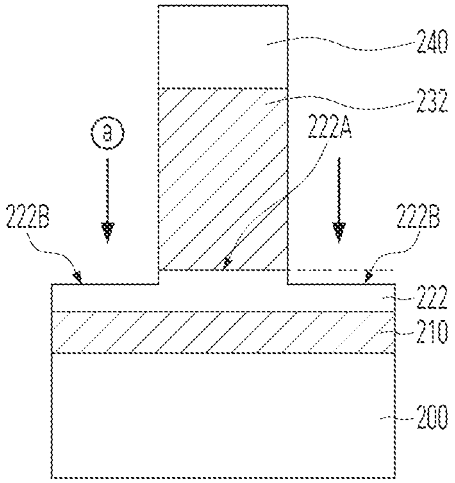

Referring to FIG. 5C, the middle electrode layer 230 may be etched using the hard mask pattern 240 as an etch barrier (see arrow ⓐ), thereby forming a middle electrode 232. In some implementations, the middle electrode 232 may have a pillar shape.

In some implementations, the etching of the middle electrode layer 230 may be performed using a reactive ion etching (RIE) method. Additionally, the etching of the middle electrode layer 230 may be performed with a target of exposing the initial selector layer 220. When etching the middle electrode layer 230, the etching may be precisely controlled and stopped at the point when the upper surface of the initial selector layer 220 is exposed. When etching the middle electrode layer 230, a portion of the initial selector layer 220 may be etched to a predetermined thickness through an excessive etching or others. The initial selector layer 220 after etching the middle electrode layer 230 will hereinafter be referred to as an initial selector pattern 222. The initial selector pattern 222 may have a portion 222A overlapping the middle electrode 232 (hereinafter referred to as an overlapping portion) and another portion 222B exposed by the middle electrode 232 (hereinafter referred to as an exposed portion). In the present embodiment, a portion of the initial selector layer 220 is etched to a predetermined thickness, and accordingly, the upper surface of the exposed portion 222B of the initial selector pattern 222 is lowered to a certain degree compared to the upper surface of the overlapping portion 222A of the initial selector pattern 222. However, the present disclosure is not limited thereto, and the upper surface of the exposed portion 222B of the initial selector pattern 222 may be located at substantially the same height as the upper surface of the overlapping portion 222A of the initial selector pattern 222 (see dotted line). In some implementations, the initial selector layer 220 and the initial selector pattern 222 may have substantially the same shape.

Figure 5D:
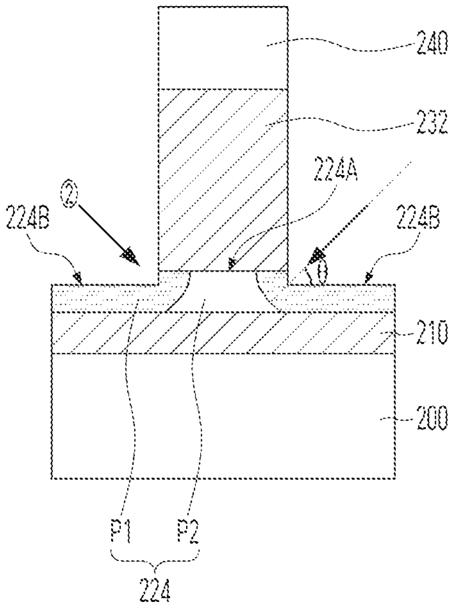

Referring to FIG. 5D, the dopant may be additionally implanted toward the initial selector pattern 222 exposed by the middle electrode 232. The implantation of the dopant will be referred to as a second dopant implantation process, and the dopant implanted during the second dopant implantation process may the same as the dopant implanted during the first dopant implantation process. In addition, the initial selector pattern 222 doped by the second dopant implantation process will be referred to as an intermediate selector pattern 224. The intermediate selector pattern 224 may include an overlapping portion 224A that overlaps the middle electrode 232 and an exposed portion 224B exposed by the middle electrode 232.

For example, when arsenic is implanted during the first dopant implantation process, arsenic may also be implanted during the second dopant implantation process. Alternatively, instead of arsenic, gallium (Ga), boron (B), indium (In), phosphorus (P), antimony (Sb), germanium (Ge), carbon (C), tungsten (W), or a combination thereof may be doped in the first and second dopant implantation processes.

In addition, the second dopant implantation process may be performed, for example, by an ion implantation method, and may be performed toward the initial selector pattern 222 in a direction forming an acute angle θ, which is greater than 0 degrees and less than 90degrees, with respect to the upper surface of the substrate 200 or the upper surface of the initial selector layer 222 (see arrow ②). In this case, the dopant of the second dopant implantation process may be implanted not only into the exposed portion 222B of the initial selector pattern 222 but also into a portion of the overlapping portion 222A of the initial selector pattern 222, which is adjacent to the exposed portion 222B. Thus, the dopant of the second dopant implantation process may be implanted into the edge of the overlapping portion 222A of the initial selector pattern 222. As a result, an intermediate selector pattern 224 having the shape as shown in FIG. 5D may be formed. A portion of the intermediate selector pattern 224 doped with the dopant of the second dopant implantation process will hereinafter be referred to as an initial first region P1, and a remaining portion not doped with the dopant of the second dopant implantation process will hereinafter be referred to as a second region P2. The initial first region P1 may include the dopant by the first and second dopant implantation processes, but the second region P2 may include the dopant by the first dopant implantation process. Therefore, the dopant concentration of the initial first region P1 may be greater than the dopant concentration of the second region P2. The initial first region P1 may be formed at the edge of the exposed portion 224B and the overlapping portion 224A of the intermediate selector pattern 224, and the second region P2 may be formed at the center of the overlapping portion 224A of the intermediate selector pattern 224, thereby having a sidewall contacting the initial first region P1. For example, the sidewall of the second region P2 may be surrounded by the initial first region P1. Since the initial first region P1 may be formed using a tilted ion implantation method, the interface between the initial first region P1 and the second region P2 may have an inclined shape with respect to the upper surface of the substrate 200. Thus, a portion of the initial first region P1, which is a part of the overlapping portion 224A, may have a width decreasing from top to bottom.

The ion implantation energy during the second dopant implantation process may be smaller than the ion implantation energy during the first dopant implantation process. This may be to prevent or reduce the dopant of the second dopant implantation process being implanted into other parts other than the initial selector pattern 222 during the second dopant implantation process. For example, when the dopant of the second dopant implantation process is implanted into the middle electrode 232, the characteristics of the middle electrode 232 may be deteriorated. Additionally, the dose amount during the second dopant implantation process may be less than the dose amount during the first dopant implantation process for the same reason.

Figure 5E:
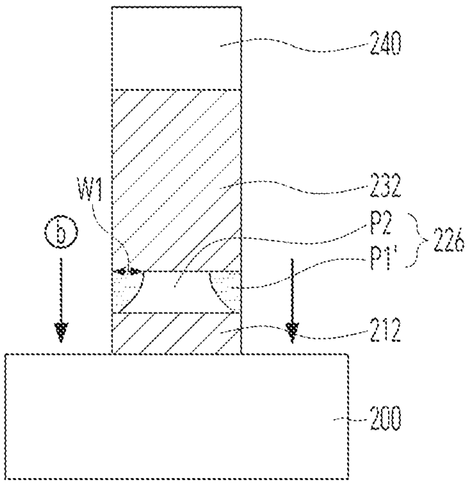

Referring to FIG. 5E, the intermediate selector pattern 224 and the lower electrode layer 210 exposed by the middle electrode 232 may be etched using the hard mask pattern 240 and the middle electrode 232 as an etch barrier (see arrow ⓑ). As a result, a selector pattern 226 and a lower electrode 212 may be formed to have a pillar shape.

The etching of the intermediate selector pattern 224 and the lower electrode layer 210 may be performed using the RIE method. The sidewalls of the selector pattern 226 and the lower electrode 212 may be aligned with the sidewall of the middle electrode 232. The selector pattern 226 may include a first region P1' located at an edge and the second region P2 whose sidewalls are in contact with the first region P1'. For example, the sidewalls of the second region P2 may be surrounded by the first region P1' as shown in the example in FIG. 5E. The first region P1' may be formed by etching the initial first region P1 of FIG. 5D. The first region P1' may have a shape in which the outer sidewall is aligned with the sidewall of the middle electrode 232, and may have a dopant concentration that is smaller than the dopant concentration of the initial first region P1'. This may be because the dopant are lost from the sidewall edge of the selector pattern 226 during this etching process.

The dopant concentration of the initial first region P1 may be in a relatively high state due to the second dopant implantation process of FIG. 5D. Therefore, even though the dopant concentration of the first region P1' decreases compared to the initial first region P1, the dopant concentration of the first region P1' may increase compared to the case where there is no second dopant implantation process. The dopant concentration of the first region P1' may be different from the dopant concentration of the second region P2.

Due to the above-described tilted ion implantation, the first region P1' may have a width that decreases from top to bottom. That is, a width W1 of the uppermost surface of the first region P1' may be the maximum among the widths of the first region P1'.

The semiconductor device of the present embodiment may be fabricated through the processes described above.

Referring again to FIG. 5E, the semiconductor device of the present embodiment may include the substrate 200, the lower electrode 212 disposed over the substrate 200, the selector pattern 226 disposed over the lower electrode 212, and the middle electrode 232 disposed over the selector pattern 226.

The lower electrode 212, the selector pattern 226, and the middle electrode 232 may have sidewalls aligned with each other.

The selector pattern 226 may include an insulating material doped with a dopant. In particular, the selector pattern 226 may include the first region P1' located at the edge from the sidewall of the selector pattern 226 and the second region P2 in contact with the first region P1' whose sidewall is surrounded by the first region P1'.

The first region P1' may have a dopant content resulting from the first and second dopant implantation processes and the etching process for forming the selector pattern 226, and the second region P2 may have a dopant content resulting from the first dopant implantation process. Accordingly, the dopant concentration of the first region P1' and the dopant concentration of the second region P2 may be different from each other.

The first region P1' may have a width that decreases from top to bottom in the vertical direction. Thus, the width W1 of the uppermost surface of the first region P1' may be maximum in the vertical direction. On the other hand, the second region P2 may have a width that increases from top to bottom.

According to the semiconductor device of the present embodiment and its fabricating method, since the dopant are additionally implanted toward the selector layer before etching for forming the selector pattern, the loss of the dopant that occurs during the etching process for forming the selector pattern can be compensated in advance.

Further, by additionally implanting the dopant into the selector layer having a horizontal upper surface before forming the selector pattern, it may be possible to implant a sufficient amount of dopant considering subsequent dopant loss. For reference, it may be possible to implant a sufficient amount of dopant during an ion implantation process when the implantation is performed on a horizontal surface, but it may be difficult to implant when the implantation is performed on a vertical surface. Therefore, when the dopant is additionally implanted toward the vertical surface, that is, the sidewall of the selector pattern, after forming the selector pattern, it may be difficult to implant a sufficient amount of dopant. The present embodiment can also solve this problem.

In order to evenly implant the dopant into portions of the edge of the selector pattern, the second dopant implantation process may be performed in a rotation manner, for example, in a manner in which an ion beam is incident while rotating the disk on which the semiconductor device is loaded. This will be illustratively described with reference to FIG. 6.

Figure 6:
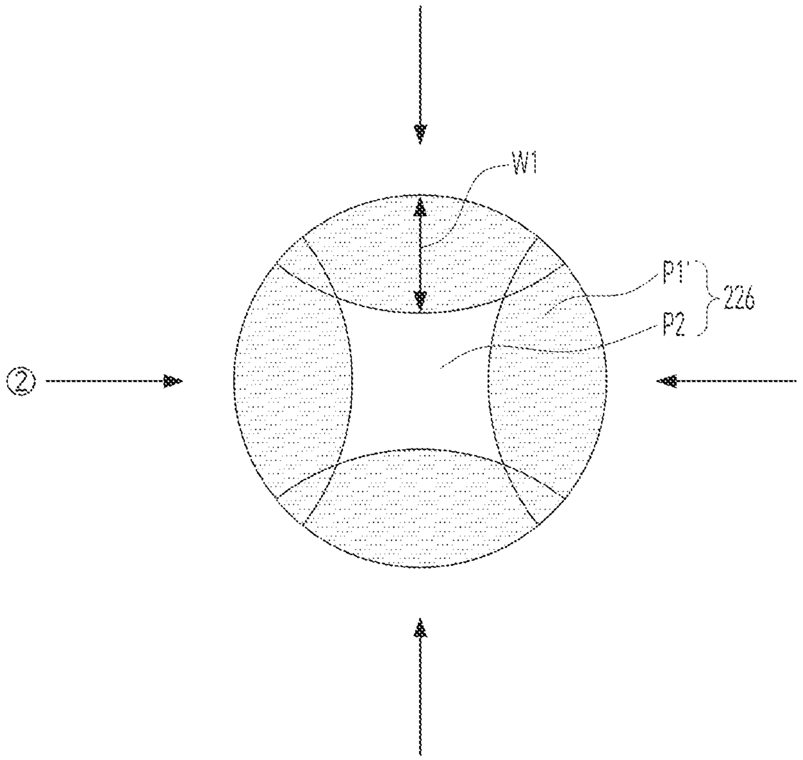
FIG. 6 is a plan view illustrating an example of a selector pattern based on some implementations of the disclosed technology.

FIG. 6 is a plan view illustrating an example of a selector pattern.

Referring to FIG. 6, the result of performing the second dopant ion implantation while rotating the process result of FIG. 5C is shown.

In the present embodiment, the second dopant ion implantation may be performed once for each 90-degree rotation of the process result of FIG. 5C in the horizontal direction. As a result, a total of four second dopant implantations may be performed. In this case, in the horizontal direction, the first region P1' may be formed at the edge of the selector pattern 226, and the second region P2 may be surrounded by the first region P1'. The width W1 of the first region P1' in the horizontal direction may vary depending on the incident angle of the ion beam.

However, the present disclosure is not limited thereto, and the rotation angle for the second dopant ion implantation and the number of the second dopant ion implantations may vary.

As described above, during the second dopant implantation process, the dopant may be implanted not only into the initial selector pattern 222 but also into the middle electrode 232 or the like. This is illustratively shown in FIG. 7.

Figure 7:
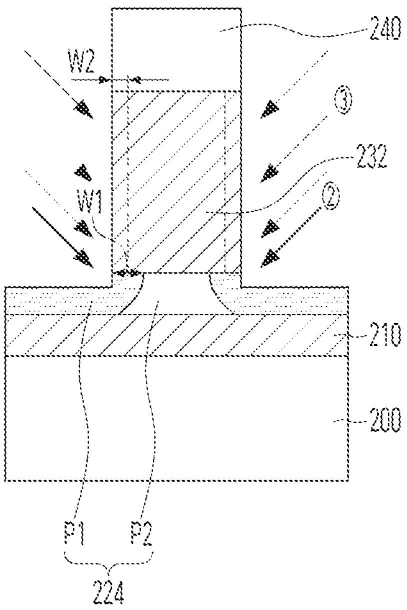
FIG. 7 is a cross-sectional view illustrating another example of a second dopant implantation process based on some implementations of the disclosed technology.

FIG. 7 is a cross-sectional view illustrating another example of a second dopant implantation process. FIG. 7 shows a step corresponding to the process in FIG. 5D. The description will focus on the differences from the process in FIG. 5D while omitting the same description as those provided in relation to FIG. 5D.

Referring to FIG. 7, during the second dopant implantation process, the dopant may be implanted not only into the initial selector pattern 222 but also into the sidewall edge of the middle electrode 232 (see dotted arrow ③).

The dopant implantation into the sidewall of the middle electrode 232 may be more difficult than the dopant implantation into the initial selector pattern 222 having a horizontal plane. Accordingly, the width W2 of the region in which the dopant is implanted through the second dopant implantation process in the middle electrode 232 may be smaller than the width W1 of the uppermost surface of the part overlapping the middle electrode 232 in the initial first region P1 of the intermediate selector pattern 224. In addition, the dopant concentration of the dopant implantation region of the middle electrode 232 may be less than the dopant concentration of the initial first region P1. When the initial first region P1 is etched and transformed into the first region (see P1' in FIG. 5E), the width W1 of the uppermost surface of the first region P1' may be larger than the width W2, and the dopant concentration of the first region P1' may be greater than the dopant concentration of the dopant implantation region of the middle electrode 232.

As a result, even if the dopant is implanted into the middle electrode 232 through the second dopant implantation process, since the width W2 and dopant concentration of the dopant implantation region of the middle electrode 232 may be relatively small, and thus, the dopant implantation region of the middle electrode 232 may not significantly affect the characteristics of the middle electrode 232.

Figure 8:
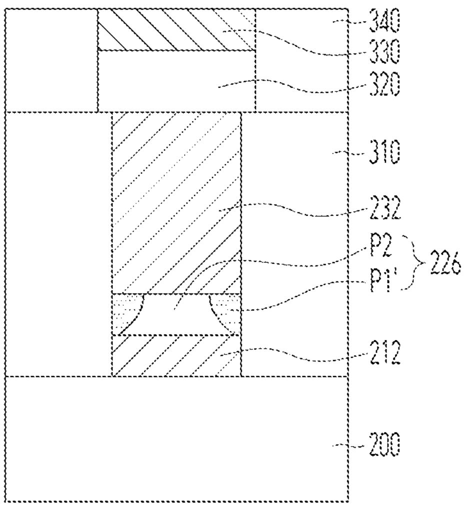
FIG. 8 is a cross-sectional view illustrating a semiconductor device and a method for fabricating the semiconductor device based on another embodiment of the disclosed technology.

FIG. 8 is a cross-sectional view illustrating a semiconductor device according to another embodiment of the present disclosure, and a method for fabricating the same. FIG. 8 shows a subsequent process that may be performed after the process of FIG. 5E.

Referring to FIG. 8, after performing the process of FIG. 5E, an insulating material covering the entire surface of the process result of FIG. 5E may be deposited, and a planarization process, such as CMP (Chemical Mechanical Polishing), may be performed until the upper surface of the middle electrode 232 is exposed. As a result, a pillar-shaped stacked structure in which the lower electrode 212, the selector pattern 226, and the middle electrode 232 are stacked, and a first interlayer insulating layer 310 that surrounds the sidewall of the stacked structure and has an upper surface planarized with the upper surface of the middle electrode, may be formed.

Subsequently, a stacked structure of a variable resistance pattern 320 and an upper electrode 330 may be formed over the middle electrode 232 and the first interlayer insulating layer 310. The stacked structure of the variable resistance pattern 320 and the upper electrode 330 may be formed by depositing a material for forming the variable resistance pattern 320 and a conductive material for forming the upper electrode 330 over the first interlayer insulating layer 310 and the middle electrode 232, and selectively etching the deposited materials. Because the variable resistance pattern 320 and the upper electrode 330 are formed using a different mask from a mask for forming the lower electrode 212, the selector pattern 226, and the middle electrode 232, the sidewalls of the variable resistance pattern 320 and the upper electrode 330 may not be aligned with the sidewalls of the lower electrode 212, the selector pattern 226, and the middle electrode 232.

Subsequently, a second interlayer insulating layer 340 surrounding the sidewall of the stacked structure of the variable resistance pattern 320 and the upper electrode 330 may be formed.

In the present embodiment, the case where the variable resistance pattern 320 is formed over the selector pattern 226 has been described, but the present disclosure is not limited thereto. In another embodiment, before forming the lower electrode 212, the selector pattern 226, and the middle electrode 232, the variable resistance pattern 320 may be formed under the lower electrode 212.

Figure 9:
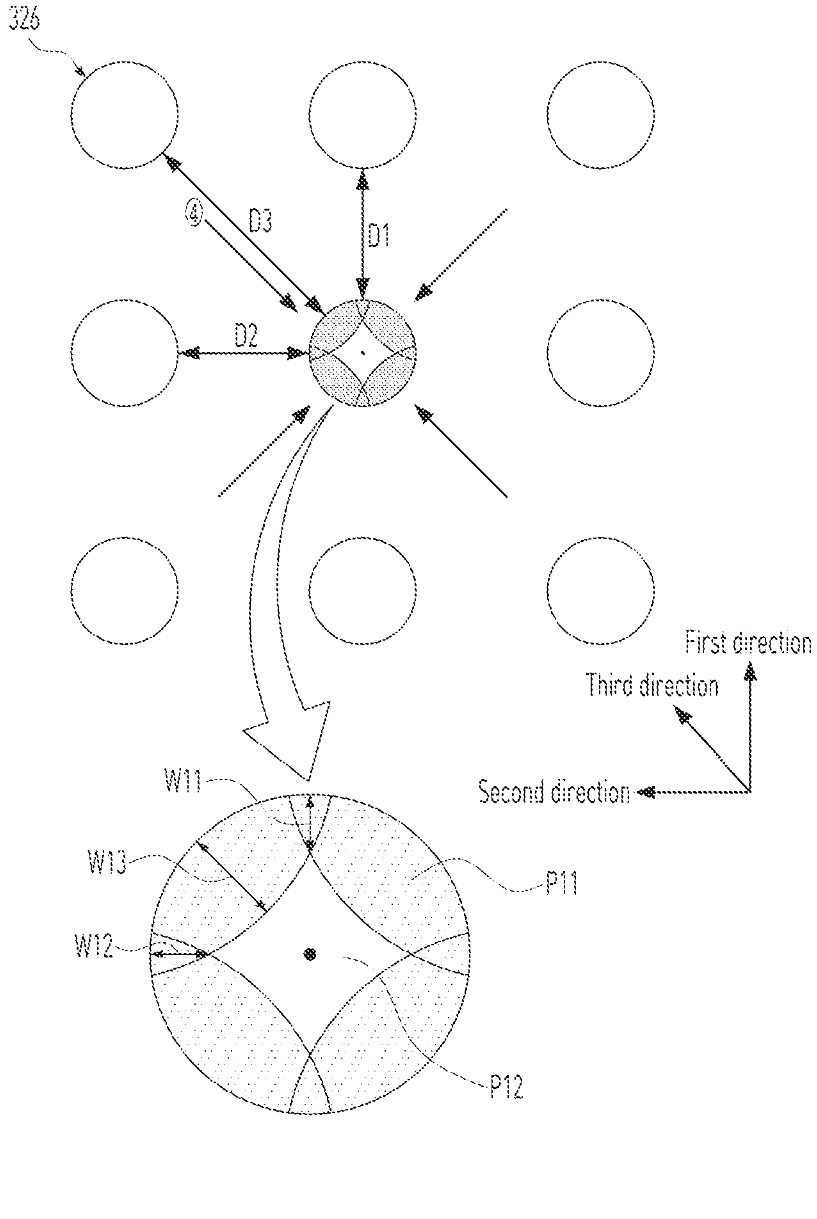
FIG. 9 is a plan view illustrating another example of a selector pattern based on some implementations of the disclosed technology.

FIG. 9 is a plan view illustrating another example of a selector pattern. In particular, FIG. 9 shows a case where a plurality of selector patterns are arranged in a matrix form along first and second directions.

Referring to FIG. 9, a plurality of selector patterns 326 may be arranged in a matrix form along the first and second directions. The distance D1 between adjacent selector patterns 326 in the first direction and the distance D2 between adjacent selector patterns 326 in the second direction may be substantially equal to each other. In addition, the distance D3 between adjacent selector patterns 326 in the diagonal direction crossing the first and second directions, that is, in the third direction, may be greater than each of the distances D1 and D2.

In this case, it may be desirable for the incident angle of the ion beam (see arrow ④) to be parallel to the third direction during the above-described second dopant implantation process. This may be because the larger the distance between adjacent selector patterns 326, the easier ion implantation. In this case, the width W13 of the first region P11 of the selector pattern 326 in the third direction may be larger than the width W11 of the first region P11 of the selector pattern 326 in the first direction or the width W12 of the first region P11 of the selector pattern 326 in the second direction. The second region P12 of the selector pattern 326 may be surrounded by the first region P11.

In the present embodiment, similar to that described in FIG. 6, the second dopant ion implantation may be performed once for each 90-degree rotation of the process result of FIG. 5C in the horizontal direction. As a result, a total of four second dopant implantations may be performed.

According to the above embodiments of the present disclosure, it may be possible to secure the characteristics of the selector by compensating for the dopant loss of the selector.

While the disclosed technology has been illustrated and described with respect to specific embodiment, it should be understood that various enhancements and modifications of the disclosed embodiments and other embodiments may be made based on what is described and illustrated in this patent document.

What is claimed is:

1. A method for fabricating a semiconductor device, comprising:

forming a selector layer by performing a first dopant implantation process to an insulating material layer so that a dopped insulating material layer of the selector layer exhibits different electrical conducting characteristics in response to an applied voltage with respect to a threshold voltage;

forming an electrode layer over the selector layer;

forming a hard mask pattern over the electrode layer;

forming an electrode pattern by etching the electrode layer using the hard mask pattern as an etch barrier in order to expose the selector layer;

performing a second dopant implantation process to the selector layer in a direction at an acute angle with respect to an upper surface of the selector layer; and forming a selector pattern by etching the selector layer exposed by the electrode pattern.

2. The method according to claim 1, wherein the first dopant implantation process and the second dopant implantation process implant a common dopant to the selector layer.

3. The method according to claim 1, wherein an ion implantation energy during the second dopant implantation process is less than an ion implantation energy during the first dopant implantation process.

4. The method according to claim 1, wherein a dopant dose amount during second dopant implantation process is less than or equal to a dopant dose amount during the first dopant implantation process.

5. The method according to claim 1, wherein the second dopant implantation process is performed while rotating a structure in which the electrode pattern is formed.

6. The method according to claim 1, wherein the selector pattern includes a plurality of selector patterns arranged in a first direction and a second direction perpendicular to the first direction, in a plan view, a distance between adjacent selector patterns among the plurality of selector patterns in the first direction and a distance between adjacent selector patterns among the plurality of selector patterns in the second direction are smaller than a distance between adjacent selector patterns among the plurality of selector patterns in a third direction crossing the first and second directions, in a plan view, and an incident angle of an ion beam during the second dopant implantation process is parallel to the third direction.

7. The method according to claim 1, during the second dopant implantation process, the dopant implantation is performed to an edge extending from a sidewall of the electrode pattern.

8. The method according to claim 1, wherein the selector pattern includes a first region that doped by the first and second dopant implantation processes and is formed in an edge extending from a sidewall of the selector pattern, and a second region that has a sidewall surrounded by the first region and is doped by the first dopant implantation process.

9. The method according to claim 8, wherein the electrode pattern includes a doped region formed by the second dopant implantation process in an edge from a sidewall of the electrode pattern, and a width of the doped region is smaller than a width of the first region of the selector pattern.

10. The method according to claim 8, wherein the electrode pattern includes a doped region formed by the second dopant implantation process in an edge from a sidewall of the electrode pattern, and a dopant concentration of the doped region is less than a dopant concentration of the first region of the selector pattern.

11. The method according to claim 1, further comprising:

forming a variable resistance pattern disposed over or under the selector pattern and electrically connected to the selector pattern before the forming of the selector layer or after the forming of the selector pattern.

* * * * *